United States Patent [19]
Hembree

[11] Patent Number: 5,783,461
[45] Date of Patent: Jul. 21, 1998

[54] TEMPORARY SEMICONDUCTOR PACKAGE HAVING HARD-METAL, DENSE-ARRAY BALL CONTACTS AND METHOD OF FABRICATION

[75] Inventor: David R. Hembree, Boise, Id.

[73] Assignee: Micron Technology, Inc., Boise, Id.

[21] Appl. No.: 726,349

[22] Filed: Oct. 3, 1996

[51] Int. Cl.[6] .......................... H01L 23/34; H01L 21/66; G01R 31/26
[52] U.S. Cl. .................... 438/17; 438/15; 438/117; 438/125; 257/48; 257/727; 257/738
[58] Field of Search ..................... 438/15, 17, 117, 438/125; 257/48, 727, 738

[56] References Cited

U.S. PATENT DOCUMENTS

| | | | |
|---|---|---|---|
| 4,899,107 | 2/1990 | Corbett et al. | 324/158 F |
| 5,006,792 | 4/1991 | Malhi et al. | 324/158 F |
| 5,037,117 | 8/1991 | Malhi et al. | 439/71 |
| 5,088,190 | 2/1992 | Malhi et al. | 29/843 |
| 5,123,850 | 6/1992 | Elder et al. | 439/67 |
| 5,289,631 | 3/1994 | Koopman et al. | 29/840 |
| 5,302,891 | 4/1994 | Wood et al. | 324/158 |
| 5,367,253 | 11/1994 | Wood et al. | 324/158.1 |
| 5,408,190 | 4/1995 | Wood et al. | 324/765 |
| 5,424,652 | 6/1995 | Hembree et al. | 324/765 |
| 5,440,240 | 8/1995 | Wood et al. | 324/765 |
| 5,451,165 | 9/1995 | Cearley-Cabbiness et al. | 493/71 |
| 5,468,999 | 11/1995 | Lin et al. | 257/784 |
| 5,483,174 | 1/1996 | Hembree et al. | 324/765 |
| 5,483,741 | 1/1996 | Akram et al. | 29/846 |
| 5,495,179 | 2/1996 | Wood et al. | 324/755 |
| 5,519,332 | 5/1996 | Wood et al. | 324/755 |
| 5,523,697 | 6/1996 | Farnworth et al. | 324/758 |
| 5,530,376 | 6/1996 | Lim et al. | 324/765 |
| 5,537,051 | 7/1996 | Jalloul et al. | 324/758 |
| 5,539,324 | 7/1996 | Wood et al. | 324/758 |
| 5,541,525 | 7/1996 | Wood et al. | 324/755 |
| 5,543,725 | 8/1996 | Lim et al. | 324/755 |
| 5,578,870 | 11/1996 | Farnworth et al. | 257/727 |
| 5,669,774 | 9/1997 | Grabbe | 439/70 |
| 5,674,785 | 10/1997 | Akram et al. | 438/17 |
| 5,691,649 | 11/1997 | Farnworth et al. | 324/755 |

*Primary Examiner*—Olik Chaudhuri
*Assistant Examiner*—Kevin F. Turner
*Attorney, Agent, or Firm*—Stephen A. Gratton

[57] ABSTRACT

A temporary package for testing semiconductor dice, a method for forming the temporary package and a method for testing dice using the temporary package are provided. The temporary package includes hard-metal ball contacts arranged in a dense grid pattern, such as a ball grid array. The dense grid pattern allows the temporary package to include a large number of ball contacts (e.g., 50 to 1000 or more) to permit testing of dice having a large number of bond pads, or dice that require a large number of input/output signals. The ball contacts can be formed of a metal such as nickel, copper or beryllium copper and are adapted to resist wear, deformation and breakage during continued use of the package. For forming the package, a package base can be formed with land pads and the ball contacts can be attached to the land pads by soldering, brazing, welding, or with a conductive adhesive.

31 Claims, 6 Drawing Sheets

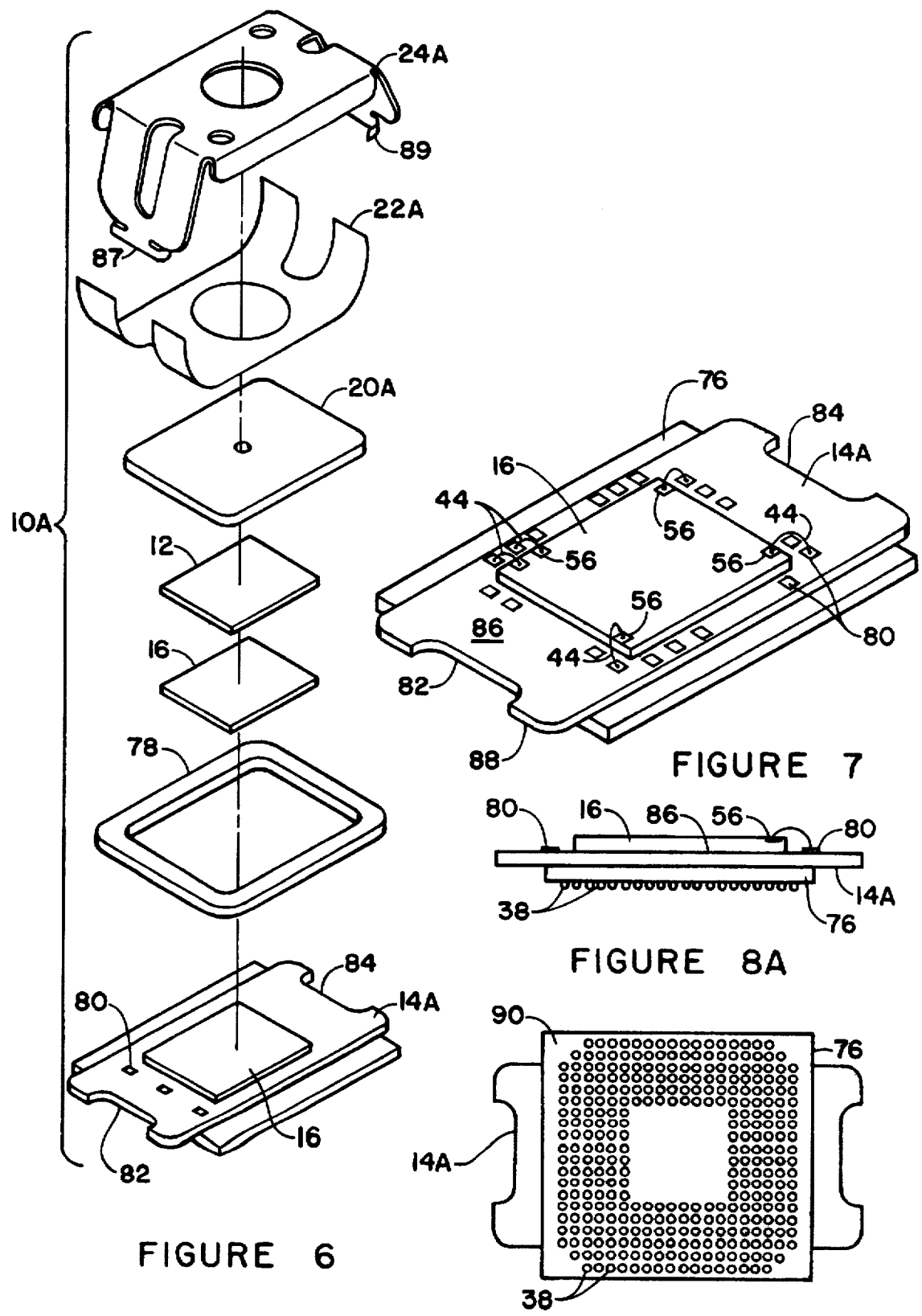

TEMPORARY SEMICONDUCTOR PACKAGE HAVING HARD-METAL, DENSE-ARRAY BALL CONTACTS AND METHOD OF FABRICATION

FIELD OF THE INVENTION

This invention relates generally to semiconductor manufacture and more particularly to an improved temporary semiconductor package having hard-metal, dense-array ball contacts and to a method for fabricating the temporary package.

BACKGROUND OF THE INVENTION

Recently, semiconductor dice have been supplied by manufacturers in an unpackaged or bare configuration. A known good die (KGD) is a bare die that has been tested to a quality and reliability level equal to an equivalent packaged product. To certify a die as a known good die the bare die must be tested and burned-in. This has led to the development of test carriers for performing burn-in and testing of bare dice. Each carrier functions as a temporary package to house a single bare die for testing, and to provide the electrical interconnection between the die and external test circuitry. Exemplary test carriers are disclosed in U.S. Pat. Nos. 5,541,525; 5,519,332; 5,302,891; and 5,408,190 to Wood et al.

One aspect of these test carriers is that the terminal contacts for the carriers are formed in configurations that provide a limited input/output capability for the carrier. Typically, the carriers include terminal contacts formed as pins that mate with corresponding sockets on a testing apparatus such as a burn-in board. With this type of terminal contact configuration there may not be enough terminal contacts on the test carrier to accommodate a die having a large number of closely spaced bond pads. In general, the bond pads on semiconductor dice are becoming smaller and more densely spaced.

In addition, it may sometimes be advantageous to provide a test carrier with a larger number of terminal contacts than device bond pads to facilitate transmitting and receiving test signals from the die. Still further, because these carriers are designed to be reusable, it would be advantageous for the terminal contacts to be wear and deformation resistant in order to provide a reliable electrical connection with the testing apparatus even with continued usage in a production environment. For example, the carriers are repeatedly mated with electrical sockets which can cause the terminal contacts to deform and wear. In addition, the carriers are repeatedly subjected to temperature cycling which can increase the electrical resistivity of the terminal contacts and stress other components of the carrier.

SUMMARY OF THE INVENTION

In accordance with the present invention, an improved temporary package for testing semiconductor dice, a method for fabricating the temporary package, and a method for testing using the temporary package are provided. The temporary package includes a base for retaining the die, an interconnect for establishing temporary electrical communication with the die, and a force applying mechanism for biasing the die and the interconnect together.

The package base includes terminal contacts comprising hard-metal ball contacts arranged in a dense grid pattern, such as a ball grid array (BGA). The ball contacts are adapted to establish electrical communication with a testing apparatus, such as a burn-in board. The ball contacts are generally spherical in shape and can be formed of a relatively hard metal such as nickel, copper, beryllium copper, alloys of nickel, alloys of copper, alloys of beryllium copper, nickel-cobalt-iron alloys, or iron-nickel alloys. Additionally, the ball contacts can include a base metal, and an outer layer formed of a non-oxidizing metal such as gold, silver, copper or palladium. The ball contacts are able to resist wear, deformation, breakage and oxidation, to provide a reliable electrical connection with the testing apparatus, even with continued usage of the temporary package in a production environment. In particular the hard-metal ball contacts are able to withstand numerous repeatable matings with the testing apparatus. In addition, the hardmetal ball contacts are adapted to support the package and to be electrically contacted anywhere along their spherical surface.

The package base can be formed of either ceramic, plastic or a glass filled resin laminate, such as FR-4. The package base can include conductors in electrical communication with the ball contacts. In addition, land pads can be formed on a surface of the base in electrical communication with the conductors. The ball contacts can be formed separately and then attached to the land pads by brazing, soldering, welding, or with an electrically conductive adhesive.

The interconnect for the package can be mounted to the package base and includes contact members that are electrically connected to the conductors formed on the package base. The interconnect can be formed of silicon with raised contact members to contact and establish electrical communication with the bond pads on the die. Alternately the interconnect can be formed with microbump contact members mounted on a plastic film attached to an interconnect substrate.

The force applying mechanism for the package includes a cover and a spring. The force applying mechanism functions to secure the die to the base and to maintain the die and interconnect in electrical contact. The spring for the force applying mechanism can be formed to operate in conjunction with a pressure plate, or alternately formed of an elastomeric material placed in direct contact with the die. The force applying mechanism can be secured to the base with a latching mechanism.

BRIEF DESCRIPTION OF THE DRAWINGS

FIG. 6 is an exploded perspective view of an alternate embodiment temporary package that includes a package base formed of FR-4 board having the ball contacts formed thereon;

FIG. 7 is an enlarged perspective view of the package base for the shown in FIG. 6;

FIG. 8A is a side elevation view of the package base for the package wn in FIG. 6;

FIG. 8B is a bottom view of FIG. 8A;

DETAILED DESCRIPTION OF THE PREFERRED EMBODIMENT

Figure 1:
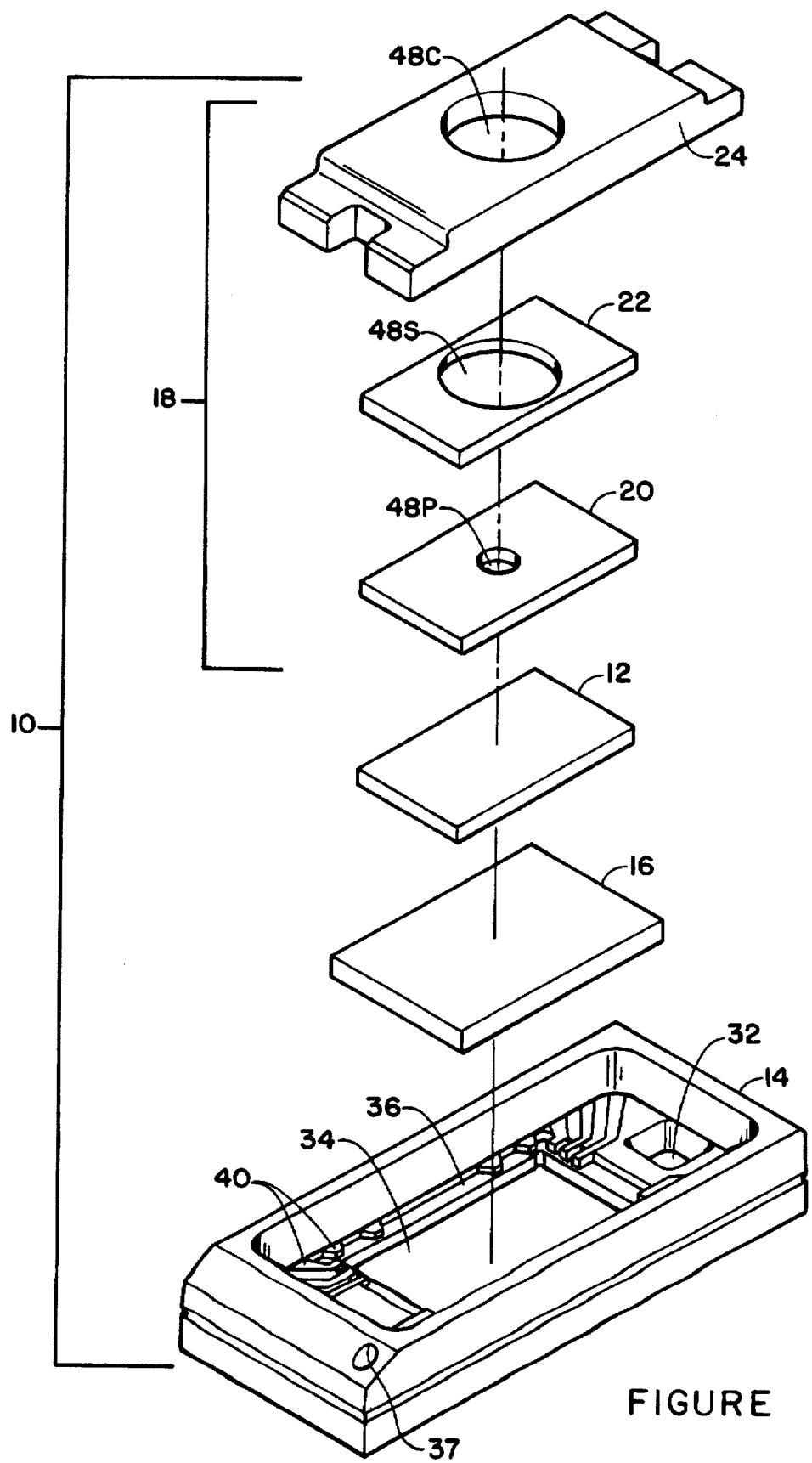
FIG. 1 is exploded perspective view with parts removed of a temporary package constructed in accordance with the invention.

Referring to FIG. 1, an exploded perspective view of a temporary package 10 constructed in accordance with the invention is shown. The temporary package 10 is adapted to retain a semiconductor die 12 and to establish a temporary electrical connection with the die 12 for testing and burn-in. Following the test procedure the die 12 can be removed from the package 10 and used as a known good die.

The temporary package 10, generally stated, includes a package base 14, an interconnect 16, and a force applying mechanism 18. The interconnect 16 establishes electrical communication between the package base 14 and the die 12. The force applying mechanism 18 secures the die 12 to the package base 14 and presses the die 12 against the interconnect 16. The force applying mechanism 18 includes a pressure plate 20, a spring 22 and a cover 24. The package 10 also includes a latching mechanism in the form of clips 26, 28 (FIG. 2) which secure the force applying mechanism 18 to the package base 14.

The package base 14 includes a pattern of conductors 40 that are in electrical communication with ball contacts 38 (FIG. 2) formed on a bottom surface 31 (FIG. 3) of the package base 14. As will be further explained, the conductors 40 on the package base 14 can be wire bonded to the interconnect 16 to provide an electrical path between the die 12 and the ball contacts 38. The package base 14 also includes an indicator pocket 37 (FIG. 1) that can be used to indicate the orientation of the ball contacts 38 with respect to the die 12 (i.e., pin #1 indicator).

Still referring to FIG. 1, the cover 24, the spring 22 and the pressure plate 20 all include a central opening which are designated 48C, 48S and 48P respectively. As will be further explained, the openings 48C, 48S and 48P are used during assembly and disassembly of the package 10. Specifically, the openings 48C, 48S and 48P permit the die 12 to be held by a vacuum tool (not shown) during optical alignment of the die 12 and interconnect 16 and assembly of the package 10. In a similar manner, the openings 48C, 48S and 48P can be used with a vacuum tool to disassemble the package 10.

Figure 2:
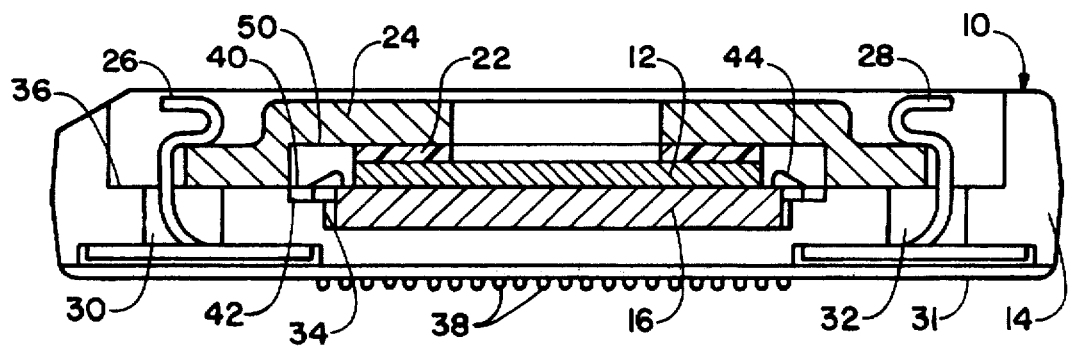
FIG. 2 is a cross section view of the assembled temporary package.

Referring to FIG. 2, the interconnect 16 is mounted within a first recess 34 formed within the package base 14. In the assembled temporary package 10, the die 12 is held within a second recess 36 formed within the package base 14 and is sandwiched between the interconnect 16 and the cover 24. As also shown in FIG. 2, in the assembled package 10, the spring 22 presses the die 12 against the interconnect 16. The spring 22 can be formed of an elastomeric material such as silicone, butyl rubber, or fluorosilicone; in foam, gel, solid or molded configurations. With the spring 22 formed of an elastomeric material, the pressure plate 20 (FIG. 1) can be omitted so that the spring 22 bears directly against the die 12. The spring 22 can also be formed of a metal in the form of a wave washer or similar configuration. In this case, the pressure plate 20 (FIG. 1) would preferably be located between the spring 22 and the die 12. Another alternate embodiment includes attaching the spring 22 to both the cover 24 and the pressure plate 20 using an adhesive. In this case, the spring 22 is sandwiched between the cover 24 and pressure plate 20 and can be configured with a larger surface area under compression.

Still referring to FIG. 2, the clips 26, 28 can be slideably attached to corresponding openings 30, 32 formed in the package base 14. The clips 26, 28 function to secure the cover 24, spring 22, and die 12 to the package base 14. The clips 26, 28 can be formed of a resilient material such as spring steel, or plastic, and are shaped to exert a retention force on the cover 24.

Furthermore, in the assembled package 10, the cover 24 can be recessed below a top surface of the package base 14. The outer peripheral size and outline of the package 10 can thus be substantially determined by the outer peripheral size and outline of the package base 14. Advantageously the outline of the package can be substantially equivalent to a conventional plastic or ceramic semiconductor package. This permits the package 10 to be used with standardized burn-in equipment for a conventional package.

Figure 3:
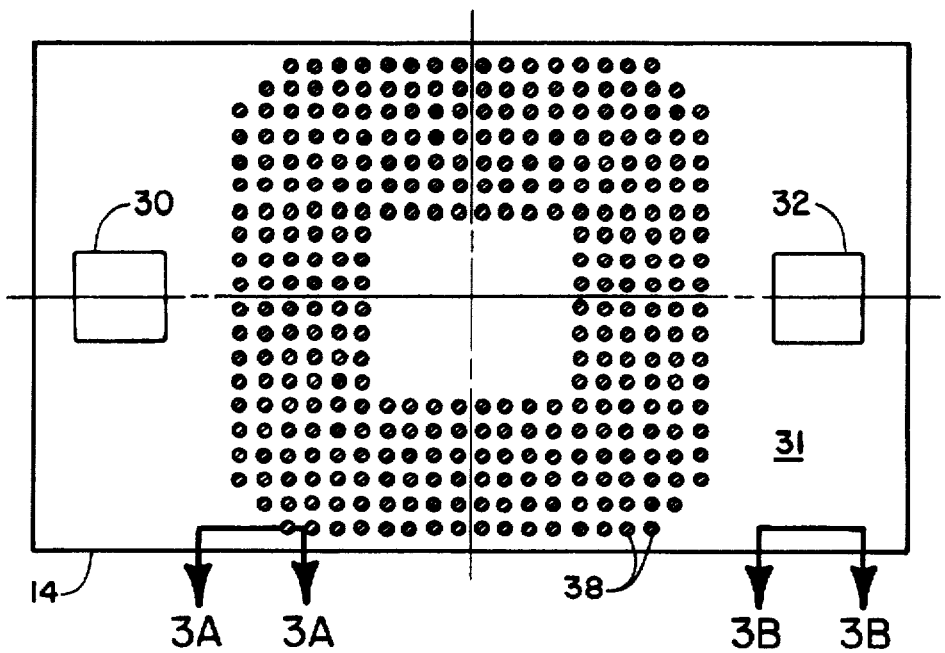
FIG. 3 is a bottom view of the temporary package showing the ball contacts formed on a surface of a package base in a dense grid pattern.

As used herein, the term conventional semiconductor package refers to a plastic or ceramic package having an outline and external lead configuration that conforms to standards of a recognized industry standard setting body. These standard setting bodies can include:

EIA/JEDEC—Electronics Industry Association-Joint Electron Device Engineering Council JEIDA—Japanese Electronics Industry Development Association PCMCIA—Personal Computer Memory Card International Association Referring to FIG. 3, the ball contacts 38 for the package 10 can be arranged in a dense grid pattern on the bottom surface 31 of the base 14. The ball contacts 38 are in electrical communication with internal conductive lines 49 (FIG. 3A) formed integrally with the package base 14. The internal conductive lines 49 are in electrical communication with the conductors 40 formed on the package base 14. As shown in FIG. 2, the conductors 40 can terminate at a bond shelf 42 and are wire bonded to the interconnect 16 using bond wires 44.

Figure 3A:
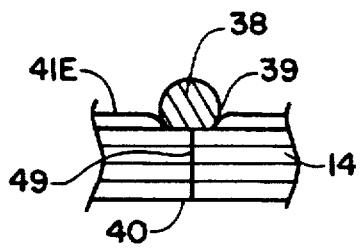
FIG. 3A is a cross sectional view of a ball contact and the package base taken along section line 3A—3A of FIG. 3.

Referring to FIG. 3A, the ball contacts 38 can be attached to flat land pads 39 formed on the package base 14 in electrical communication with the internal conductive lines 49. The land pads 39 can be formed of a suitable metal or stack of metals. Exemplary metals can include gold, copper, silver, tungsten, tantalum, platinum, palladium, and molybdenum or alloys of these metals. An exemplary stack can include a gold layer with nickel underplating. Other exemplary stacks can include other combinations of the above metals. A plating process can be used to form the flat land pads 39. Such a plating process can include electrolytic or electroless deposition of a metal layer followed by resist coating, exposure, development, and selective wet chemical etching. Typically, the exposed surface of the land pads 39 will be an electroplated non-oxidizing metal such as gold.

The ball contacts 38 can be generally spherical in shape. The ball contacts 38 can be formed separately and then attached to the land pads 39 by soldering, brazing, welding, or applying a conductive adhesive. For example, a solder or conductive adhesive can be screened or otherwise dispensed onto the land pads 39. The ball contacts 38 can then be bonded to the solder or conductive adhesive, using heat and pressure as required. Alternately, solder or conductive adhesive can be applied directly to the ball contacts 38 which can then be placed on the land pads 39.

The ball contacts 38 can be formed out of a hard metal such as nickel, copper, beryllium copper or alloys nickel, copper and beryllium copper. Other suitable metals include "KOVAR" (i.e., nickel-cobalt-iron alloy) and "ALLOY 42" (i.e., iron-nickel alloy). In addition, the ball contacts 38 can be formed of a base metal as specified above and plated with a highly conductive, non-oxidizing, metal such as gold, silver, copper, or palladium. Plating can be during formation of the ball contacts 38 or after they have been attached to the package 10. An exemplary diameter of the ball contacts 38 can be from about 0.020 inches to 0.040 inches. An exemplary center line to center line spacing (pitch) of the ball contacts 38 will be dependent on the ball diameter but can be about 0.040 inches or greater. Depending on the size of the package base 14 from 50 to 1000 or more ball contacts 38 can be included on a temporary package 10.

Figure 10A:
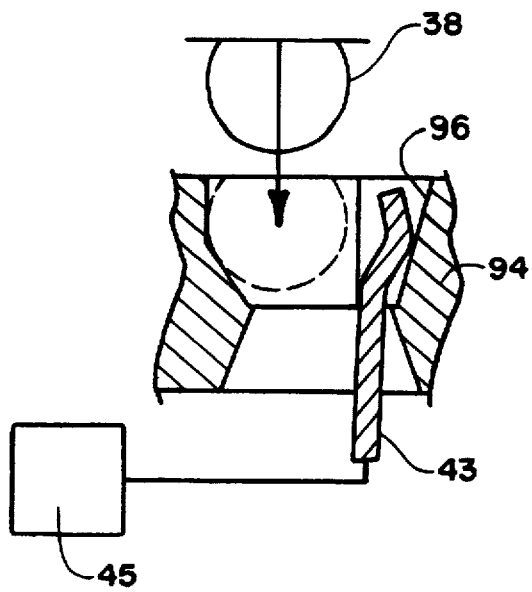
FIG. 10A is a schematic cross sectional view illustrating the ball contact of the temporary package prior to insertion into a socket of a testing apparatus such as a burn-in board.

As will be further explained, the ball contacts 38 are adapted to be contacted by a mating electrical connector such as a contact 43 (FIG. 10A) which is in electrical communication with external test circuitry 45 (FIG. 10A). Furthermore, because the ball contacts 38 are formed of a relatively hard metal as compared to typical tin/lead solder balls they can be contacted anywhere along their spherical surface including along a lower hemispherical portion thereof.

The ball contacts 38 can be formed in a dense grid pattern such as a ball grid array (BGA). With a dense grid pattern the density of the ball contacts 38 is high in relation to the total area occupied by the ball contacts 38. This relationship is sometimes expressed as a "packing fraction". In general, the packing fraction of a pattern of contacts is the area occupied by the contacts over the total area available. For example, contacts formed in a grid pattern of one hundred forty four one inch square blocks in an area twelve inches by twelve inches would yield a packing fraction of one. A pattern of one hundred forty four one inch diameter round contacts in a grid of one hundred forty four one inch squares would yield a packing fraction of 0.7854. In actual practice, packing fractions close to one are not possible because some spacing is required between the contacts in order to minimize shorting between adjacent contacts. In general, a dense grid pattern as herein defined will have a packing fraction of 0.25 or greater.

Figure 3B:
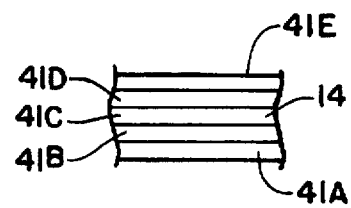
FIG. 3B is a cross sectional view of the package base showing the laminated construction thereof taken along section line 3B—3B of FIG. 3.

As shown in FIG. 3B, the package base 14 can be a multi layer block formed of fired laminated ceramic layers 41A–41E such as alumina ($Al_2O_3$). Such a process is described in U.S. Pat. No. 5,519,332 which is incorporated herein by reference. Briefly, this process involves forming metallized circuits in the x, y and z planes. These circuits are formed on green sheets of ceramic using a suitable metallization process and are interconnected with metal filled vias. The green sheets are then pressed together and sintered at high temperatures to form a unitary structure. Using this process the conductors 40 (FIG. 2) and land pads 39 (FIG. 3A) can be formed using suitable metals and then interconnected by forming internal conductive lines 49 (FIG. 3A). In addition, as shown in FIG. 3A, the land pads 39 can be recessed below the outermost ceramic layer 41E.

The package base 14 can also be formed using a 3-D injection molding process out of a high temperature glass filled plastic or out of a glass filled resin laminate such as FR-4 board. Such a process is described in the previously incorporated U.S. Pat. No. 5,519,332. Suitable plastics include polyetherimide (PEI), polyethersulfone (PES), polyarylsulfone (PAS), polyphenylene sulfide (PPS), liquid crystal polymer (LCP) and polyether-ether ketone (PPEK). An injection molding process with these or other suitable plastics can be used to form the package base 14 with the desired external and internal geometries. During a subsequent metallization process, various circuit patterns including the conductors 40 and land pads 39 can be formed on the package base 14 and can be interconnected by forming the internal conductive lines 49.

Figure 4:
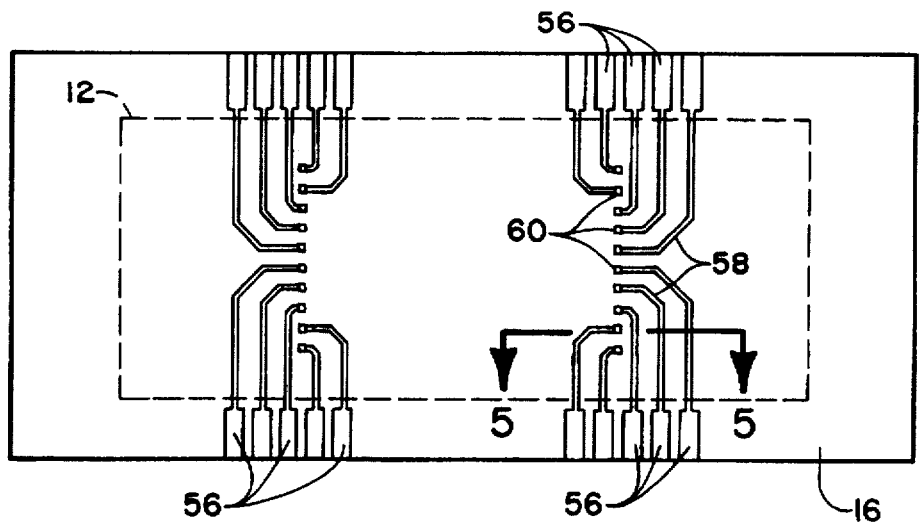
FIG. 4 is a plan view of an interconnect for the temporary package with the outline of a semiconductor die superimposed thereon.
Figure 5:
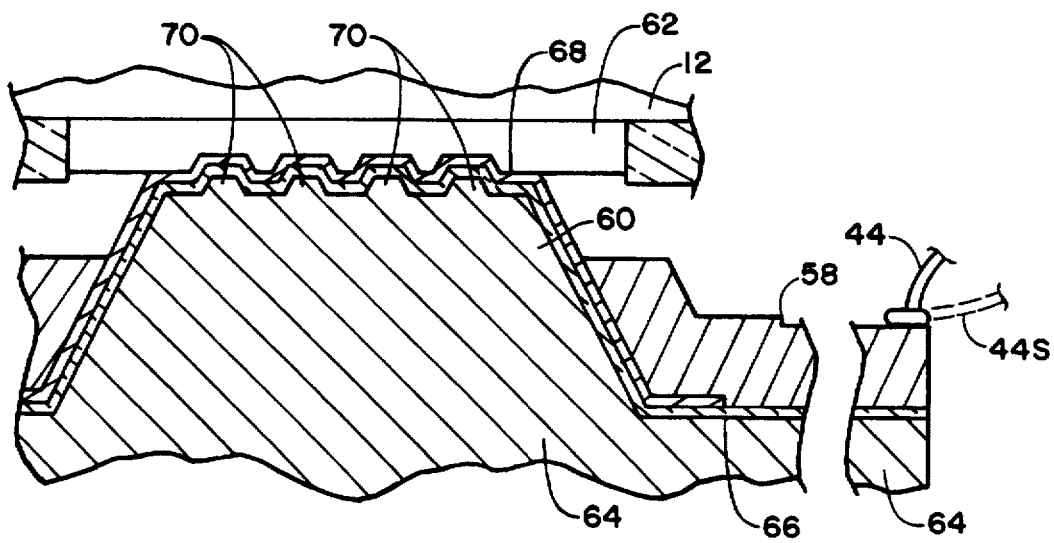
FIG. 5 is a cross sectional view of the die and interconnect taken along section line 5—5 of FIG. 4.

Referring to FIG. 4, the interconnect 16 for the temporary package 10 is shown separately. The interconnect 16 includes bonding pads 56 that can be wire bonded or otherwise electrically connected to the conductors 40 (FIG. 1) formed on the package base 14 (FIG. 1). The interconnect 16 also includes conductive traces 58 and raised contact members 60. As shown in FIG. 5, each raised contact member 60 is adapted to contact and establish an electrical connection with a device bond pad 62 (or other contact location) on the die 12. In addition, the raised contact members 60 include penetrating projections 70 formed as elongated blades adapted to penetrate the device bond pads 62 to a self limiting penetration depth.

The interconnect 16 and raised contact members 60 can be formed by etching a silicon substrate 64. Following etching of the contact members 60, an insulating layer 66 is formed over the entire substrate. In addition, a conductive layer 68 is formed on each raised contact member 60. The conductive layers 68 are in electrical communication with the conductive traces 58. The conductive traces 58 can be wire bonded to bond wires 44 which are wire bonded to the conductors 40 (FIG. 1) on the package base 14 to provide a conductive path to and from the contact members 60. Alternately, in place of wire bonding, an electrical path can be formed to the conductive traces 58 with non-bonded mechanical electrical contacts 44S such as clips or slide contacts. Tab tape (not shown) can also be utilized to electrically connect the conductors 40 (FIG. 1) on the base 14 to the conductive traces 58 on the interconnect 16.

A suitable process for forming the contact members 60 substantially as shown in FIG. 5 is disclosed in U.S. Pat. No. 5,326,428 and U.S. Pat. No. 5,419,807 which are incorporated herein by reference.

Figure 5A:
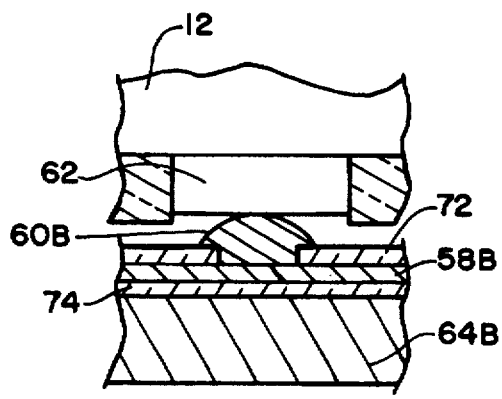
FIG. 5A is a cross sectional view equivalent to FIG. 5 of an alternate embodiment interconnect having microbump contact members formed on flexible tape and mounted to an interconnect substrate.

With reference to FIG. 5A, the interconnect 16 can also be formed with microbump contact members 60B and conductive traces 58B formed on a plastic film 72. The microbump contact members 60B and plastic film 72 can be similar to multi layered TAB tape such as "ASMAT" manufactured by Nitto Denko. The plastic film 72 can be mounted to an interconnect substrate 64B using a compliant adhesive layer 74. The compliant adhesive layer 74 can be formed of a silicone elastomer, an epoxy or a polyimide material. One method for forming an interconnect with microbump contact members is described in U.S. Pat. No. 5,634,267 incorporated herein by reference.

Referring to FIGS. 6–8B, an alternate embodiment temporary package 10A constructed in accordance with the invention is shown. The package 10A includes a force applying mechanism in the form of a bridge clamp 24A and a spring 22A that function substantially similar to the equivalent components previously described. In addition, the package 10A includes a base 14A with a BGA substrate 76 having the ball contacts 38 formed thereon. The package 10A also includes a seal member 78 to prevent contaminants from entering the interior of the assembled package 10A. The seal member 78 can be formed of a resilient elastomeric material or of a hard plastic or metal material.

The package base 14A can be formed out of an epoxy-glass resin, such as FR-4 board, bismaleimidetriazine (BT) resin, or similar materials used to make printed circuit boards. The package base 14A includes cut out portions 82, 84 configured to receive corresponding clip portions 87, 89 (FIG. 6) of the bridge clamp 24A (FIG. 6). The interconnect 16 can be attached to a first surface 86 (FIG. 7) of the package base 14A using an adhesive layer (not shown). The surface 86 of the package base 14A also includes bonding pads 80 in electrical communication with the ball contacts 38.

As shown in FIGS. 8A and 8B, the BGA substrate 76 of the package base 14A includes a dense grid pattern of ball contacts 38 formed on a surface 90 thereof. The ball contacts 38 can be formed of a hard material using an attachment process substantially as previously described. Internal conductors (not shown) can also be formed in the package base 14A, such as by forming and filling vias, to electrically interconnect the ball contacts 38 to the bonding pads 80. The bonding pads 80 can be formed of a wire bondable metal such as aluminum or gold using a suitable deposition process (e.g., screen printing).

As shown in FIG. 7, the bonding pads 80 on the package base 14A can be wire bonded to the bonding pads 56 on the interconnect 16 with bond wires 44. Alternately, an electrical path can be provided between the interconnect 16 and the package base 14A using TAB tape (not shown) or a mechanical electrical connectors such as spring contacts (not shown) to electrically interconnect the bonding pads 80 on the package base 14A with the bonding pads 56 on the interconnect 16. The sealing member 78 can be shaped or formed with grooves to seal the interior of the package and to prevent contact with the bond wires 44.

Figure 9:
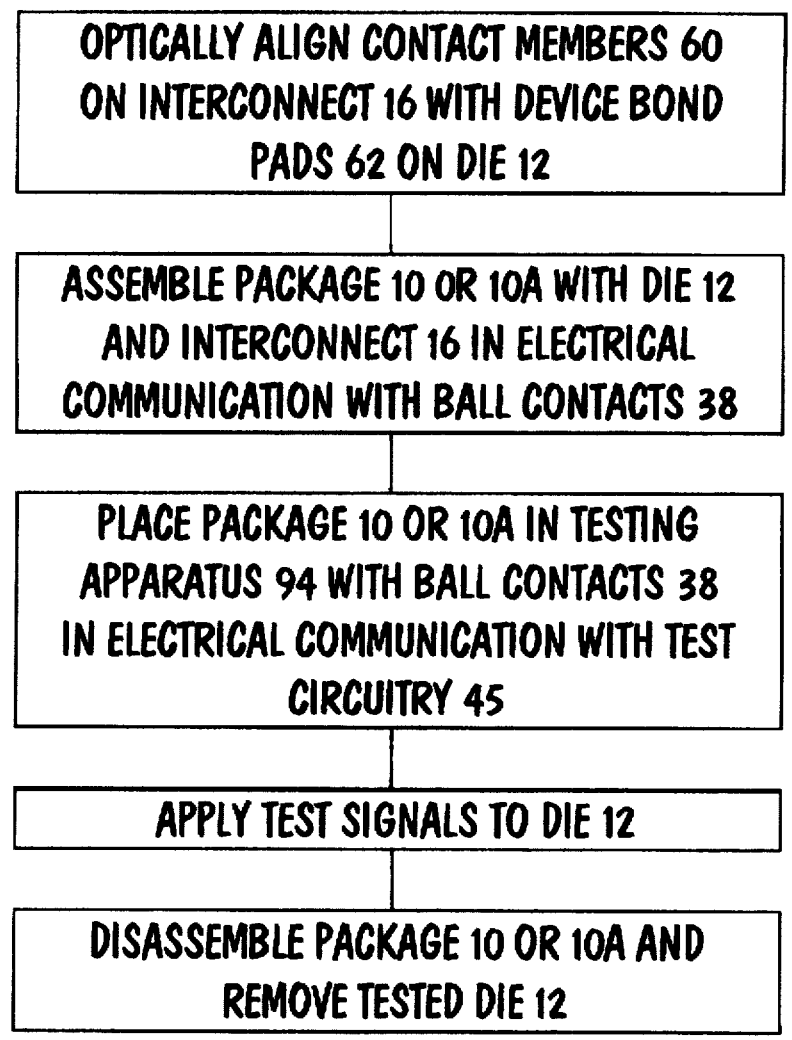
FIG. 9 is a schematic block diagram of a method for testing a semiconductor die using a temporary package constructed in accordance with the invention.

Referring to FIG. 9, a process sequence for testing the die 12 using a temporary package 10 (FIG. 1) or 10A (FIG. 6) is shown. Initially the contact members 60 (FIG. 5) or 60B (FIG. 5A) on the interconnect 16 for the package 10 or 10A can be optically aligned with the device bond pads 62 on the die 12.

With the die 12 and interconnect 16 aligned, the package 10 (FIG. 1) or 10A (FIG. 6) can be assembled by attaching the cover 24 (FIG. 1) or bridge clamp 24A (FIG. 6) to the package base 14 or 14A. U.S. Pat. No. 5,634,267 filed Nov. 14, 1994, incorporated herein by reference, describes an automated apparatus suitable for optically aligning the die 12 and the interconnect 16 and assembling the package 10 (FIG. 1) or 10A (FIG. 6).

Figure 10B:
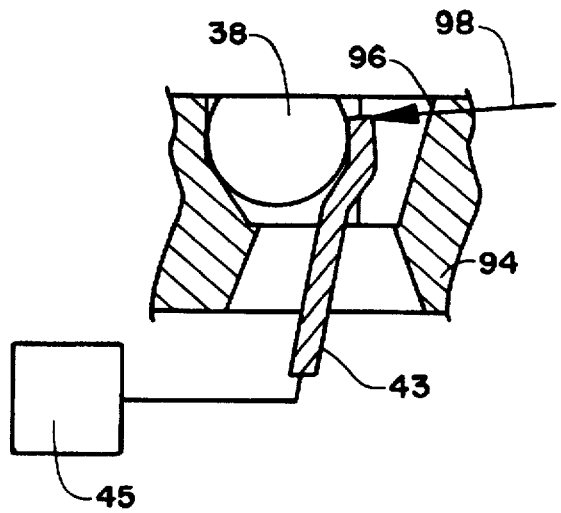
FIG. 10B is a schematic cross sectional view of the ball contact after insertion into the socket illustrating the electrical engagement of a contact on the socket with the ball contact.

Next, as shown schematically in FIGS. 10A and 10B, the package 10 or 10A is placed in a testing apparatus 94. The testing apparatus 94 is adapted to establish temporary electrical communication with the ball contacts 38 formed on the package 10 or 10A. The testing apparatus 94 includes a plurality of openings 96 configured to receive the ball contacts 38. An electrical contact 43 is formed in each opening 96 in electrical communication with test circuitry 45. As shown in FIG. 10A, the opening 96 receives the ball contact 38 with the contact 43 in an unactuated position with a zero insertion force. As shown in FIG. 10B, actuation of the contact 43 presses the contact 43 against the ball contact 38 as indicated by force vector 98. The contact 43 can be actuated by a mechanical lever or a rocker constructed as is known in the art. This type of contact is adapted to exert a wiping action on the ball contact 38 which breaks through the native oxide coating of the ball contact 38. For example, zero insertion force sockets for ball grid array semiconductor packages are available from Plastronics of Irving, Tex..

Since the ball contacts 38 are formed of a relatively hard metal rather than a solder material as with conventional semiconductor BGA packages, wear on the ball contacts 38 is greatly reduced. This allows the packages 10 or 10A to be reused multiple times to establish a reliable electrical connection with the contacts 43 on the testing apparatus 94. In addition, breakage of material from the ball contacts 38 is lessened. This also improves the performance of the test apparatus 94 because broken material can cause shorting and actuation problems with the contacts 43. Also ball contacts made of solder or with a solder coating as with conventional semiconductor packages can leave oxides and solder on the contacts 43. This can cause resistance to increase requiring the contacts 43 to be cleaned periodically.

Figure 10C:
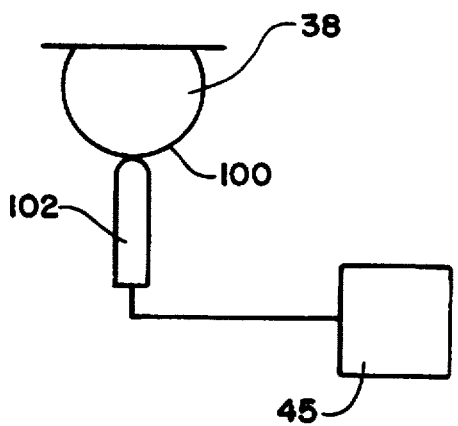
FIG. 10C is a schematic view of the ball contact being electrically contacted along a bottom hemispherical portion thereof by a pin type electrical contact.

Referring to FIG. 10C, because the ball contacts 38 are formed of a hard metal, contact can be made along a lower hemispherical portion 100 of the ball contacts 38. For example, electrical connectors 102 can be pogo pins in electrical communication with the test circuitry 45. Electrical contact can also be made with the lower hemispherical portion 100 of the ball contacts 38 using a conductive material such as a z-axis anisotropic conductive elastomer. In addition the lower hemispherical portion 100 of the ball contacts 38 can be used to support the package 10 or 10A during handling. This is not possible with conventional semiconductor packages having solder balls because the solder balls should not be deformed or contaminated due to process considerations. For example, conventional BGA semiconductor packages are configured to be reflow soldered to a substrate. Any deformation or contamination of the solder balls can affect the reflow process. Accordingly the weight of the package should not be placed on the solder balls.

Following the assembly procedure and electrical connection of the package 10 or 10A to the testing apparatus 94, test signals can be applied through the ball contacts 38 to test the die 12. Testing can include full functionality testing as well as burn-in testing. Following the test procedure, the package 10 or 10A can be disassembled using an assembly tool (not shown) substantially as previously described for the assembly procedure. A die 12 which passes the test procedure is thus certified as a known good die.

Thus the invention provides an improved temporary package, an improved test procedure and an improved method for making temporary packages for testing semiconductor dice. While the invention has been described with reference to certain preferred embodiments, as will be apparent to those skilled in the art, certain changes and modifications can be made without departing from the scope of the invention as defined by the following claims.

What is claimed is:

1. A temporary package for testing a semiconductor die, comprising:

a base comprising an array of metal ball contacts and a plurality of contact members configured to establish electrical communication with the die; and a plurality of electrical paths on the base electrically connecting the ball contacts and the contact members;

the ball contacts comprising a wear resistant metal;

the ball contacts comprising generally spherically shaped members configured for multiple electrical engagements with mating electrical connectors of a test apparatus.

2. The package as claimed in claim 1 wherein the ball contacts are attached to land pads on a surface of the base.

3. The package as claimed in claim 1 wherein the wear resistant metal comprises a metal selected from the group consisting of nickel, copper, beryllium copper, alloys of nickel, alloys of copper, alloys of beryllium copper, nickel-cobalt-iron alloys, and iron-nickel alloys.

4. A temporary package for testing a semiconductor die, comprising:

a base;

an interconnect on the base, the interconnect comprising a plurality of contact members for making temporary electrical connections with the die; and an array of metal ball contacts on the base in electrical communication with the contact members on the interconnect;

each ball contact comprising a generally spherically shaped member configured for multiple electrical engagements with a mating electrical connector of a test apparatus;

each ball contact comprising a metal selected from the group consisting of nickel, copper, beryllium copper, alloys of nickel, alloys of copper, alloys of beryllium copper, nickel-cobalt-iron alloys, and iron-nickel alloys.

5. The package as claimed in claim 4 wherein each ball contact comprises a non-oxidizing outer layer.

6. The package as claimed in claim 4 wherein the base comprises a plurality of pads and each ball contact is attached to a pad.

7. The package as claimed in claim 4 wherein the base comprises a plurality of internal conductors in electrical communication with the ball contacts.

8. The package as claimed in claim 4 wherein the ball contacts are contained on a separate substrate attached to the base.

9. The package as claimed in claim 8 further comprising a force applying mechanism attached to the base for biasing the die against the interconnect.

10. A temporary package for testing a semiconductor die, comprising:

a base comprising an array of land pads formed on a surface thereof;

a plurality of contact members on the base for establishing temporary electrical connections with the die, the contact members in electrical communication with the land pads; and a plurality of ball contacts attached to the land pads, the ball contacts comprising generally spherical shaped members formed of a wear resistant metal and configured for multiple electrical engagements with electrical connectors of a testing apparatus.

11. The temporary package as claimed in claim 10 wherein the wear resistant metal comprises a metal selected from the croup consisting of nickel, copper, beryllium copper, alloys of nickel, alloys of copper, alloys of beryllium copper, nickel-cobalt-iron alloys, and ironnickel alloys.

12. The temporary package as claimed in claim 11 wherein the ball contacts include an outer layer comprising a non-oxidizing metal.

13. The temporary package as claimed in claim 12 wherein the non-oxidizing metal comprises a metal selected from the group consisting of gold and palladium.

14. A temporary package for testing a semiconductor die, comprising:

a base;

a substrate attached to the base, the substrate comprising a plurality of ball contacts formed thereon in a ball grid array, the ball contacts comprising generally spherically shaped, wear resistant members configured for multiple electrical engagements with mating electrical connectors of a test apparatus;

an interconnect on the base, the interconnect comprising a plurality of contact members in electrical communication with the ball contacts and configured to form temporary electrical connections with the die; and a force applying mechanism attached to the base for biasing the interconnect towards the die.

15. The package as claimed in claim 14 wherein the ball contacts comprise a material selected from the group consisting of nickel, copper, beryllium copper, alloys of nickel, alloys of copper, alloys of beryllium copper, nickel-cobalt-iron alloys, and iron-nickel alloys.

16. The package as claimed in claim 15 wherein the ball contacts comprise non-oxidizing outer layers.

17. The package as claimed in claim 16 wherein the substrate comprises a glass filled resin.

18. The package as claimed in claim 17 wherein the interconnect comprises a silicon substrate and the contact members comprise etched members covered with conductive layers.

19. The package as claimed in claim 17 wherein the contact members comprise microbumps mounted to a flexible tape attached to the interconnect.

20. A system for testing a semiconductor die comprising:

a testing apparatus comprising test circuitry and a socket containing a plurality of electrical contacts in electrical communication with the test circuitry; and a temporary package comprising:

a base comprising a plurality of contact members for making temporary electrical connections with the die;

an array of metal ball contacts on the base in electrical communication with the contact members;

each ball contact comprising a generally spherically shaped member configured for multiple electrical engagements with a mating electrical contact on the socket;

each ball contact comprising a metal selected from the group consisting of nickel, copper, beryllium copper, alloys of nickel, alloys of copper, alloys of beryllium copper, nickel-cobalt-iron alloys, and iron-nickel alloys.

21. The system as claimed in claim 20 wherein the base includes a plurality of land pads and the ball contacts are attached to the land pads.

22. A method for fabricating a temporary package for testing a semiconductor die, comprising:

providing a plurality of ball contacts comprising generally spherically shaped members formed of a wear resistant metal and configured for multiple electrical engagements with mating electrical connectors of a test apparatus;

forming a base configured to retain the die;

forming contact members on the base configured to establish temporary electrical connections with the die; and attaching the ball contacts to the base in a ball grid array and in electrical communication with the contact members.

23. The method as claimed in claim 22 wherein the ball contacts comprise non-oxidizing outer layers.

24. The method as claimed in claim 22 wherein the wear resistant metal comprises a metal selected from the group consisting of nickel, copper, beryllium copper, alloys of nickel, alloys of copper, alloys of beryllium copper, nickel-cobalt-iron alloys, and ironnickel alloys.

25. A method for fabricating a temporary package for testing a semiconductor die, comprising:

forming a base configured to retain the die;

forming an array of land pads on the base;

mounting an interconnect to the base comprising contact members in electrical communication with the land pads and configured to establish temporary electrical connections with the die;

attaching a plurality of metal ball contacts to the land pads;

each ball contact comprising a generally spherically shaped member configured for multiple electrical engagements with a mating electrical contact on the socket;

each ball contact comprising a metal selected from the group consisting of nickel, copper, beryllium copper, alloys of nickel, alloys of copper, alloys of beryllium copper, nickel-cobalt-iron alloys, and iron-nickel alloys.

26. The method as claimed in claim 25 wherein attaching the metal ball contacts comprises a process selected from the group consisting of soldering, brazing, welding, and applying a conductive adhesive.

27. The method as claimed in claim 25 wherein the base comprises ceramic and forming the land pads comprises a metallization process.

28. The method as claimed in claim 26 wherein the base comprises plastic and forming the land pads comprises a metallization process.

29. The method as claimed in claim 25 further comprising plating the ball contacts with a non-oxidizing metal.

30. A method for testing a semiconductor die comprising:

providing a test apparatus comprising test circuitry and a plurality of electrical connectors in electrical communication with the test circuitry;

providing a temporary package configured to retain the die, the package comprising:

a base comprising a plurality of contact members for making temporary electrical connections with the die;

an array of metal ball contacts on the base in electrical communication with the contact members, each ball contact comprising a generally spherically shaped, wear resistant member;

placing the contact members in electrical communication with the die;

placing the ball contacts in electrical communication with the electrical connectors; and applying test signals through the ball contacts and the contact members to the die.

31. The method as claimed in claim 30 wherein the ball contacts comprise a metal selected from the group consisting of nickel, copper, beryllium copper, alloys of nickel, alloys of copper, alloys of beryllium copper, nickel-cobalt-iron alloys, and iron-nickel alloys.

* * * * *